(12) United States Patent
Steffens et al.

(10) Patent No.: US 11,700,719 B2
(45) Date of Patent: Jul. 11, 2023

(54) NONUNIFORM AIR GRID

(71) Applicant: Rohde & Schwarz GmbH & Co. KG, Munich (DE)

(72) Inventors: Johannes Steffens, Munich (DE); Josef Koeppl, Munich (DE); Martin Kappels, Munich (DE); Stefan Dannerbauer, Munich (DE); Stefan Aman, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 0 days.

(21) Appl. No.: 17/820,484

(22) Filed: Aug. 17, 2022

(65) Prior Publication Data
US 2023/0060180 A1 Mar. 2, 2023

(30) Foreign Application Priority Data
Aug. 26, 2021 (EP) .................................... 21193283

(51) Int. Cl.
*H05K 9/00* (2006.01)

(52) U.S. Cl.
CPC ......... *H05K 9/0086* (2013.01); *H05K 9/0041* (2013.01); *H05K 9/0088* (2013.01)

(58) Field of Classification Search
CPC ............................ H05K 9/0041; H05K 9/0086
See application file for complete search history.

(56) References Cited

U.S. PATENT DOCUMENTS

| 3,584,134 A | 6/1971 | Nichols et al. |
| 3,690,606 A | 9/1972 | Pall |
| 3,821,463 A | 6/1974 | Bakker |
| 5,386,345 A | 1/1995 | Matsuzaki et al. |
| 2007/0095567 A1 | 5/2007 | Boyce et al. |
| 2011/0243723 A1 | 10/2011 | Chen |
| 2012/0285738 A1* | 11/2012 | Cochrane ............. H05K 9/0045 174/382 |
| 2013/0094170 A1* | 4/2013 | Gilliland ............. H05K 9/0041 361/818 |
| 2019/0309963 A1 | 10/2019 | Zaki et al. |
| 2021/0148653 A1 | 5/2021 | Dinulescu et al. |

FOREIGN PATENT DOCUMENTS

| DE | 1924449 A1 | 1/1970 |
| DE | 4215456 A1 | 11/1992 |
| EP | 1383138 A1 | 1/2004 |
| KR | 101642814 B1 | 7/2016 |

* cited by examiner

*Primary Examiner* — Hung V Ngo
(74) *Attorney, Agent, or Firm* — Christensen O'Connor Johnson Kindness PLLC

(57) ABSTRACT

A housing wall includes at least one air grid having at least a first layer with a first mesh structure and a second layer with a second mesh structure. The first mesh structure is coextensively arranged with the second mesh structure. The first layer and the second layer are electrically conductively coupled. The first mesh structure includes a first plurality of through-holes. The second mesh structure includes a second plurality of through-holes. The through-holes of the first plurality of through-holes are misaligned compared to through-holes of the second plurality of through-holes such that a nonuniform total through-hole configuration of the air grid is provided.

8 Claims, 3 Drawing Sheets

18, 20    22, 24

18, 20    22, 24

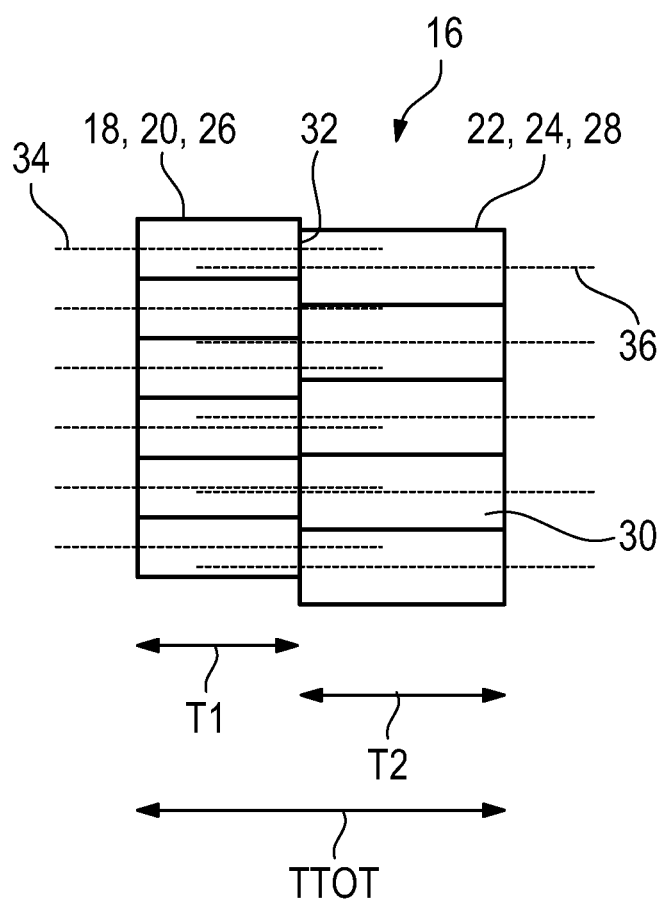

NONUNIFORM AIR GRID

FIELD OF THE DISCLOSURE

The present disclosure generally relates to a housing wall for an electric or electronic device.

BACKGROUND

Electric and electronic devices usually have to fulfill CE/EMI (European conformity/electromagnetic interference) regulations. The devices need to resist external electromagnetic radiation and also are not allowed to emit electromagnetic radiation themselves outside the limits defined by international standards over a steadily increasing frequency range. These regulations and requirements are of particular relevance in view of electronic test equipment. Influences on the measurement results in any way or a burden of the test setup with artifacts are to be avoided as best as possible. Otherwise any conclusions drawn in view of a device under test inspected by the test equipment may potentially be false. For example, a misleading conclusion could be drawn in view of the device under test as to the (non-)compliance with the known CE/EMI standards.

Ensuring a bidirectional shielding of electromagnetic radiation in the gigahertz (GHz) range complying with the CE/EMI standards without simultaneously impairing a heat exchange between an inside and an outside of a housing of an electronic device is difficult. The relevance of sufficient heat exchange is further strengthened in view of the ever-increasing packaging and power density of electronic products. A sufficient cooling requires airflow rates to dissipate power losses as high as possible.

One approach to provide sufficient cooling mechanisms makes use of air ventilation through the use of air grids implemented in housing walls of the respective electronic devices. For example, airs grids may be used having larger-sized holes, such as homogeneously distributed honeycomb-shaped holes. However, classic air grids are limited with regard to their electromagnetic shielding properties. Therefore, the size of the holes is gradually reduced in view of increasing requirements for electromagnetic shielding for applications at higher frequencies, such as within the GHz range. Though grid structures having geometrically small holes are advantageous for electric shielding, they show strongly reduced air exchange capabilities between the inside and the outside of the housing. This causes severe risks for heat accumulation and increased dirt deposits inside the housing of the device as well as unwanted resonance noise.

Accordingly, there exists a need for a technique providing sufficient cooling properties while simultaneously allowing for sufficient electromagnetic shielding of electronic devices.

SUMMARY

A summary of certain embodiments disclosed herein is set forth below. It should be understood that these aspects are presented merely to provide a brief summary of these embodiments and that these aspects are not intended to limit the scope of this disclosure. This disclosure may encompass a variety of aspects that may not be set forth below.

According to an aspect, a housing wall is disclosed. In an embodiment, the housing wall comprises at least one air grid having at least a first layer with a first mesh structure and a second layer with a second mesh structure is provided. The first mesh structure is coextensively arranged with the second mesh structure. The first layer and the second layer are electrically conductively coupled. The first mesh structure comprises a first plurality of through-holes. The second mesh structure comprises a second plurality of through-holes. The through-holes of the first plurality of through-holes are misaligned compared to through-holes of the second plurality of through-holes such that a nonuniform total through-hole configuration of the air grid is provided.

The electrical connection between the layers provide the possibility to electrically shield the cross-sectional surface area of the air grid. The nonuniformity of the through-holes of the different layers improves the electromagnetic shielding properties. The inhomogeneity of the two mesh structures in relation to each other results in a non-congruent, irregular overall total through-hole configuration. The penetration of resonant electromagnetic waves as well as higher harmonics thereof are dampened due to the irregularities induced by the nonuniform through-hole configuration. In some embodiments, the nonuniform through-hole configuration guarantees that barriers for electromagnetic waves are provided, especially within the GHz range. Consequently, the occurrence of standing waves is greatly reduced. Simultaneously, sufficient air ventilation for effectively dissipating the thermal energy of the electronic device is achieved since the total cross-sectional opening area may still be large and the single irregular through-holes still provide sufficient diameters for an effective air exchange.

Spoken differently, the air ventilation mechanism is especially provided by the air grid in view of opposite sides with respect to the air grid such that air exchange between these opposite sides is guaranteed.

The total through-hole configuration of the air grid can also be aperiodic or chaotic. In some embodiments, the total through-hole configuration of the air grid can be configured such that it shows no repetition.

Optionally, the through-holes of the first mesh structure may be oriented in parallel and shifted compared to the through-holes of the second mesh structure with regard to respective extension axes. In other words, the direction of the lateral extension of the first mesh structure is same with the lateral extension of the coextensive second mesh structure. However, the extension axes of the through-holes of both mesh structures do not coincide but are shifted with regard to each other according to a top view onto the mesh structures. In other words, at least some of the through-holes of the first mesh structure are not coaxially aligned with any of through-holes of the second mesh structure in view of the respective extension axes of the through-holes. In some embodiments, not even a single through-hole of the first mesh structure is coaxially aligned with any of the through-holes of the second mesh structure in view of the respective extension axes.

Spoken differently, a coextensive arrangement may be considered an arrangement of the first layer having the first mesh structure and the second layer having the second mesh structure where the respective surface-wise extending structures of the layers are arranged in parallel to each other. However, it is not required that the layers are flat. Rather, the layers may also comprise curved surfaces which are arranged side by side.

The through-holes of the first mesh structure distinguish from the through-holes of the second mesh structure at least with regard to one of a cross-sectional area, a shape, and a circumference. In some embodiments, the differences are observable in a top view onto the mesh structures. For example, the first mesh structure may have through-holes having a triangular cross-sectional shape. Then, the second mesh structure may have through-holes having a circular cross-sectional shape or a different cross-sectional shape. Also, the through-holes can distinguish from each other with regard to the opening size.

In addition, at least one of the cross-sectional areas, the shape, and the circumference of the through-holes of any of the mesh structures may also vary among each of the mesh structures throughout the lateral extension.

According to another aspect, the first layer and the second layer can be, for example, electrically conductively coupled at a plurality of connection points establishing a surface-wise electrical connection. Therefore, a perforated structure is established substantially representing a Faraday cage which provides good shielding properties. The connection points distributed over the entire surface area of the first and second layers increase the mechanical strength. In some embodiments, the stiffness of the shielding walls is improved. Thereby, advantages in terms of weight reduction and resource conservation are obtained.

The first mesh structure may comprise a pattern of through-holes having a first shape (cross-sectional shape). The second mesh structure may comprise a pattern of through-holes having a second shape. The first shape and the second shape may be determined according to a top view onto the mesh structures. The first shape and the second shape may be same or may be different from each other. In some embodiments, the first shape and the second shape are different. The different shapes of the through-holes contribute to the irregularity of the total through-hole configuration of the air grid. Therefore, a periodicity of the through-holes may be avoided.

Optionally, the second mesh structure may comprise a through-hole pattern which represents a non-integer multiple of a through-hole pattern of the first mesh structure. In other words, the (cross-sectional) size of the through-holes of the first mesh structure may be a noninteger of the (cross-sectional) size of the trough-holes of the second mesh structure. Furthermore, the extension axes of the through-holes of the first mesh structure may be located according to a noninteger distance of the distance between the extension axes of the second mesh structure. This improves the non-uniformity of the total through-hole configuration of the air grid.

The first layer and the second layer may at least partially be coupled via soldering. Soldering the layers to each other may be performed at various connection points in a very efficient manner. Accordingly, the manufacturing efficiency is high.

In some embodiments, at least one of vapor phase soldering, ultrasonic welding, and an electrically conductive adhesive connection may be used to couple the first layer and the second layer. Accordingly, a high mechanical strength may be achieved such that a rigid housing wall including the air grid is provided.

Optionally, the housing wall comprises a thickness of 5 mm or more along an extension axis of the through-holes of the mesh structures, for example of 7 mm or more, further for example of 10 mm or more. The thickness of the housing wall results in the through-holes having an extension length. This provides a tunnel effect which strongly dampens the propagation of electromagnetic waves. Especially combining the extension length of the through-holes with a polygonal shape provides additional dampening of the electromagnetic waves.

The first mesh structure and the second mesh structure may at least partially comprise an electrically conductive material. Accordingly, the shielding effect against electromagnetic radiation is improved.

Spoken differently, in addition to the electrical conductive coupling between the first layer and the second layer the mesh structures of the separate layers may also comprise at least partially an electrically conductive material. Accordingly, the electrical conductive material may be provided in an spaciously distributed fashion. Hence, also the effect of the electrical shielding may be provided spaciously distributed along the mesh structures as well as the layers.

The electrical shielding of the housing wall may at least be configured for reducing the penetration of electromagnetic waves having a frequency of 1 GHz or more, for example of 5 GHz or more, for example of 10 GHz or more.

In other words, the cross-sectional opening of through-holes of the mesh structures may be chosen such that the cross-sectional opening of through-holes of the total though-hole configuration causes a reduction of the penetration of electromagnetic waves having the specified frequencies. In some embodiments, distances of the opposite side walls encompassing the respective through-holes may be chosen such that the cross-sectional surface area of the respective through-holes is limited and, thus, a reduction of the electromagnetic waves is guaranteed.

The through-holes of the first mesh structure may comprise a quasi-polygonal basic shape. The through-holes of the second mesh structure can comprise a quasi-honeycomb basic shape. Thereby, the nonuniformity of the total through-hole configuration of the air grid is improved.

In addition, for each mesh structure, at least some through-holes may comprise a shape which deviates from the shape which the remaining through-holes of the same mesh structure generally have.

The shape of the through-holes among a specific mesh structure is not required to remain constant. At least one of the first mesh structure and the second mesh structure may be non-regular. For example, the first mesh structure may comprise through-holes which generally comprise a specific shape, such as a honeycomb (cross-sectional) shape. Other through-holes of the same first mesh structure may then comprise a shape representing a distorted honeycomb (quasi-honeycomb). Accordingly, for each mesh structure each through-hole or at least some through-holes may generally have an individual shape and/or size and/or circumference. Thereby, the irregularity of each mesh structure is improved on an individual basis leading also to additional nonuniformity of the total through-hole configuration of the air grid.

As an option, at least one of the first mesh structure and the second mesh structure may comprise through-holes for which their extension axes can be distorted relative to extension axes of remaining through-holes of the respective mesh structure. That means that the side walls of at least some of the through-holes are at least partially not aligned perpendicular to the lateral extension of the mesh structure but are tilted in this regard.

In effect, the nonuniformity of the total through-hole configuration may relate to misaligned extension axes of the through-holes of the different mesh structures. It may also relate to at least partially non-matching (misaligned) cross-sectional areas of the through-holes according to a top view onto the through-holes. Furthermore, the nonuniformity may relate to different shapes of the through-holes and/or different sizes of the through-holes with regard to their cross-sectional openings. Moreover, the through-holes of each mesh structure may even differ from other through-holes of the same mesh structure. Hence, a nonuniform total through-hole configuration of the air grid is provided greatly reducing the penetration of resonant electromagnetic waves as well as higher harmonics thereof.

In addition, the first layer and the second layer may comprise different thicknesses. For example, the first layer may have a first thickness and the second layer may have a second thickness. Then, the second thickness may be greater than the first thickness. This leads to additional irregularity of the total through-hole configuration of the air grid.

According to another option, the air grid may also comprise additional layers comprising mesh structures with through-holes. Accordingly, additional irregularities may be introduced into the system. For example, the total through-hole configuration of the air grid may also comprise three layers each having through-holes generally comprising (cross-sectional) shapes which distinguish between the layers (circular/honeycomb/square).

Any of the aspects mentioned hereinabove may be (sub-)combined with any other aspect provided that the skilled artisan is accordingly provided with conceivable developments.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

FIG. 5 is a schematic drawing of a portion of the total through-hole configuration of the air grid according to a cross-sectional side view.

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

Figure 1:
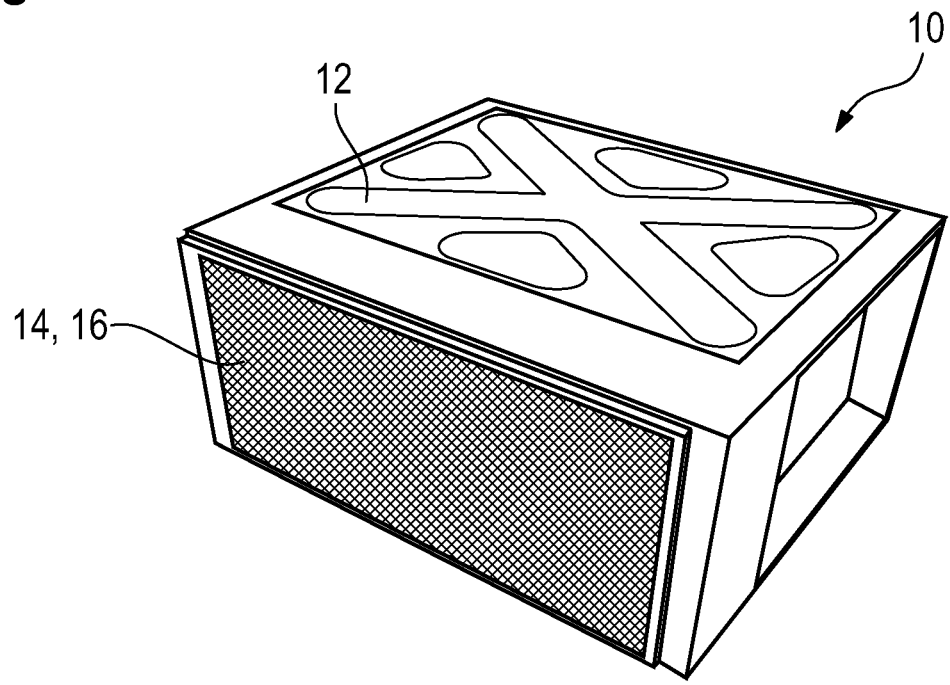
FIG. 1 is a schematic drawing of an electronic device comprising a housing wall in accordance with an embodiment of the disclosure.

FIG. 1 is a schematic drawing of an electronic device 10 comprising a housing 12. The housing 12 comprises a housing wall 14. The housing wall 14 comprises an air grid 16 for providing air exchange between an interior space surrounded by the housing 12 and an exterior space. Accordingly, thermal energy (heat) produced by the internal components of the electronic device 10 may be effectively transported towards the exterior space.

Figure 2:
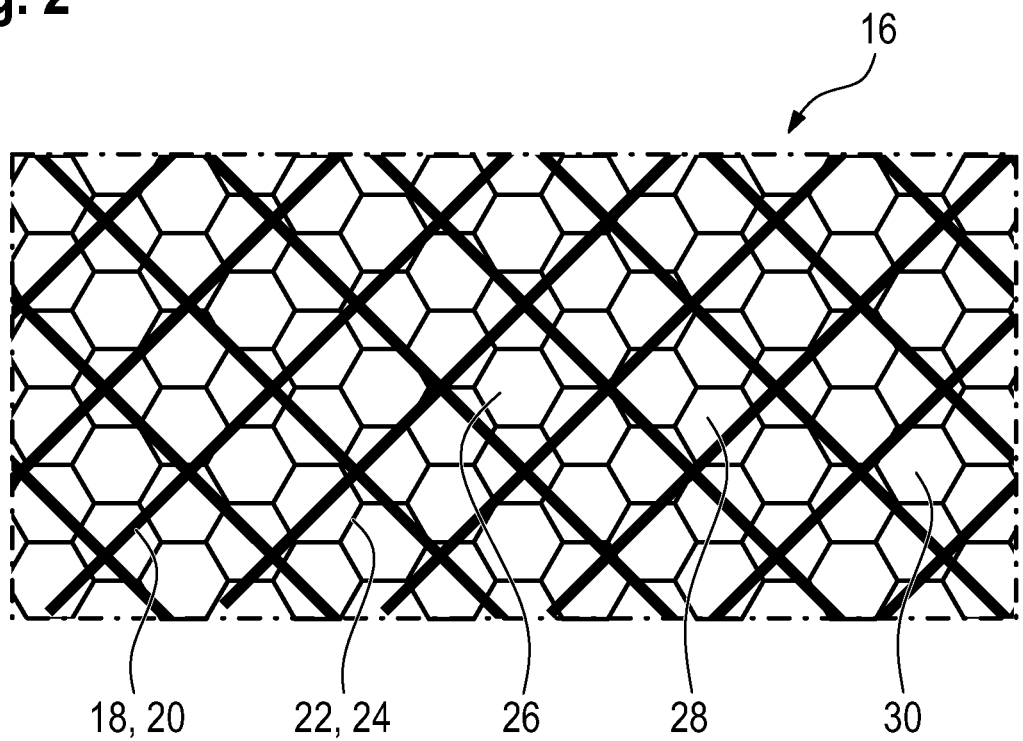
FIG. 2 is a schematic drawing of a portion of the total through-hole configuration of an air grid.

FIG. 2 is a schematic drawing of a portion of the total through-hole configuration 30 of the air grid 16. There is a first layer 18 comprising a first mesh structure 20. In addition, there is also a second layer 22 comprising a second mesh structure 24. The first layer 18 is coextensively arranged with the second layer 22.

According to this embodiment, the first mesh structure 20 comprises a first type of through-holes 26. The second mesh structure 24 comprises a second type of through-holes 28. The first type of through-holes 26 is different compared to the second type of through-holes 28. Furthermore, the first type of through-holes 26 and the second type of through-holes are not any integers of each other with regard to their specific shapes, sizes (cross-sectional opening areas) or circumferences.

In this embodiment, the first type of through-holes 26 has a tetragonal shape, more particular a square shape, and the second type of through-holes 28 has a honeycomb shape.

In addition, the first mesh structure 20 and the second mesh structure 24 are arranged such that a total through-hole configuration 30 of the air grid 16 is achieved which is nonuniform. In other words, the extension axes of the different types of through-holes 26, 28 are neither coaxially aligned nor arranged at specific constant distances. Also, the extension axes of a particular mesh structure are not arranged at distances which represent an integer distance of the distance of the extension axes of the remaining mesh structure. That leads to a total through-hole configuration 30 of the air grid 16 which is aperiodic or even chaotic. Therefore, the shielding provided by the housing wall 14 with regard to the penetration of resonant electromagnetic waves as well as higher harmonics is improved compared to the case of a single type of through-holes or an air grid 16 which shows a periodic total through-hole configuration 30.

Figure 3:
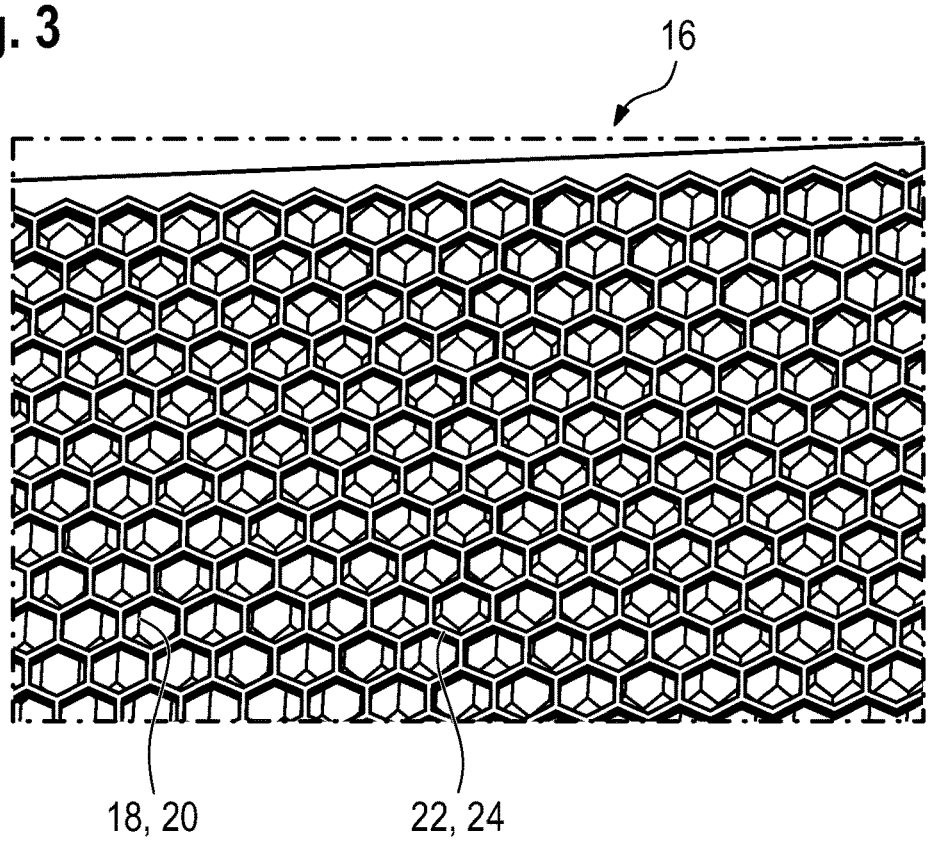
FIG. 3 is a schematic drawing of a portion of the total through-hole configuration of the air grid according to a front view.
Figure 4:
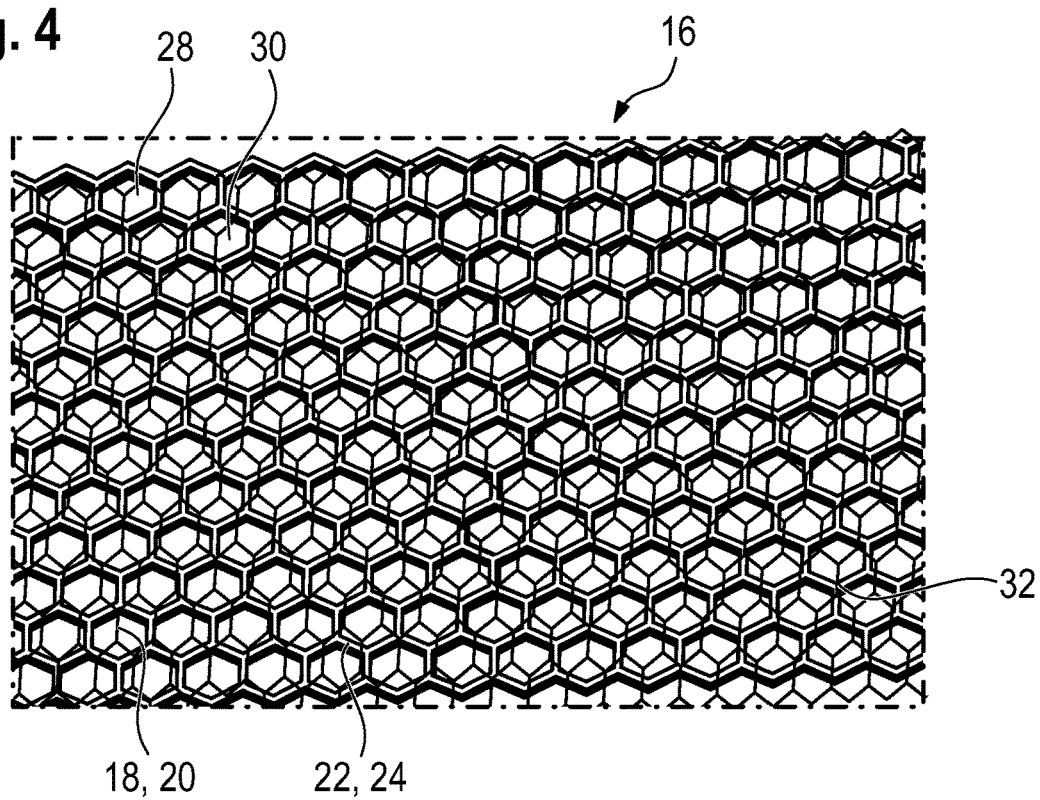
FIG. 4 is a schematic drawing of a portion of the total through-hole configuration of the air grid according to a rear view.

FIG. 3 is a schematic drawing of a portion of the total through-hole configuration 30 of the air grid 16 according to a front view. FIG. 4 is a schematic drawing of a portion of the total through-hole configuration 30 of the air grid 16 according to a rear view.

The first layer 18 and the second layer 22 are both made from a metallic material. Both layers 18, 22 are coextensively aligned. The through-holes 26, 28 of the various layers 18, 22 comprise different through-hole lengths, which can be best seen in FIG. 4. The length of the through-holes 28 of the second layer 22 are longer than the length of the through-holes 26 of the first layer 18. Thus, the second layer 22 is thicker than the first layer 18.

Moreover, the first layer 18 and the second layer 22 are coupled at various connection points 32 with each other. Soldering is applied in this regard. In some embodiments, vapor phase soldering may be applied. Some additional suitable coupling techniques comprise ultrasonic welding and the use of an electrically conductive adhesive. Since the layers 18, 22 are made of metallic materials, the multiple connections points 32 between the first and the second layer 18, 22 points establish a surface-wise electrical connection. Accordingly, the shielding against electromagnetic radiation is further improved as the connection points 32 represent a Faraday cage.

In addition, as is best visible within the rear view according to FIG. 4, at least some through-holes 28 of the second mesh structure 24 vary in shape with regard to remaining through-holes 28 of the same second mesh structure 24. In other words, the mesh structure 24 is non-regular. Generally, of course both or all mesh structures 20, 24 may be non-regular. The nonuniformity of the air grid 16 is further improved by providing through-holes 26, 28 which generally have analog shapes (here a honeycomb shape) but which based on an individual viewpoint distinguish from each other. This may be easily provided by distorting the respective mesh structure 24 before coupling the layers 18, 22 to each other.

FIG. 5 is a schematic drawing of a portion of the total through-hole configuration 30 of the air grid 16 according to a cross-sectional side view.

The air grid 16 has a total thickness TTOT along the extension axes of the through-holes 26, 28. The total thickness may for example be 5 mm or more, for example 7 mm or more, further preferable 10 mm or more.

The first layer 18 comprises a mesh structure 20 with through-holes 26 which have a length along their extension axes 34 corresponding to a first thickness T1 of the first layer 18. The second layer 22 comprises a mesh structure 24 with through-holes 28 which have a length along their extension axes 36 corresponding to a second thickness T2 of the second layer 22. According to this embodiment the first thickness T1 is different compared to the second thickness T2. In some embodiments, the first thickness T1 is smaller than the second thickness T2. Therefore, the nonuniformity of the air grid 16 is further improved.

As is indicated, the extension axes 34, 36 of the through-holes 26, 28 of the different layers 18, 22 are not aligned with regard to each other which additionally improves the irregularity of the total through-hole configuration 30 of the air grid 16.

In the foregoing description, specific details are set forth to provide a thorough understanding of representative embodiments of the present disclosure. It will be apparent to one skilled in the art, however, that the embodiments disclosed herein may be practiced without embodying all of the specific details. In some instances, well-known process steps have not been described in detail in order not to unnecessarily obscure various aspects of the present disclosure. Further, it will be appreciated that embodiments of the present disclosure may employ any combination of features described herein.

The present application may reference quantities and numbers. Unless specifically stated, such quantities and numbers are not to be considered restrictive, but exemplary of the possible quantities or numbers associated with the present application. Also, in this regard, the present application may use the term "plurality" to reference a quantity or number. In this regard, the term "plurality" is meant to be any number that is more than one, for example, two, three, four, five, etc. The term "about," "approximately," etc., means plus or minus 5% of the stated value.

It should be noted that for purposes of this disclosure, terminology such as "upper," "lower," "vertical," "horizontal," "fore," "aft," "inner," "outer," "front," "rear," etc., should be construed as descriptive and not limiting the scope of the claimed subject matter. Further, the use of "including," "comprising," or "having" and variations thereof herein is meant to encompass the items listed thereafter and equivalents thereof as well as additional items. Unless limited otherwise, the terms "connected," "coupled," and "mounted" and variations thereof herein are used broadly and encompass direct and indirect connections, couplings, and mountings.

Throughout this specification, terms of art may be used. These terms are to take on their ordinary meaning in the art from which they come, unless specifically defined herein or the context of their use would clearly suggest otherwise.

The principles, representative embodiments, and modes of operation of the present disclosure have been described in the foregoing description. However, aspects of the present disclosure, which are intended to be protected, are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure as claimed.

The embodiments of the invention in which an exclusive property or privilege is claimed are defined as follows:

1. A housing wall for a housing of an electric or electronic device, the housing wall comprising:
    at least one air grid having at least a first layer with a first mesh structure and a second layer with a second mesh structure,
    wherein the first mesh structure and the second mesh structure at least partially comprise an electrically conductive material,
    wherein the first mesh structure is coextensively arranged with the second mesh structure,
    wherein the first layer and the second layer are electrically conductively coupled,
    wherein the first mesh structure comprises a first plurality of through-holes, wherein the second mesh structure comprises a second plurality of through-holes,
    wherein the through-holes of the first plurality of through-holes are misaligned compared to through-holes of the second plurality of through-holes such that a nonuniform total through-hole configuration of the air grid is provided, wherein the total through-hole configuration is irregular,
    wherein the housing wall provides an electrical shielding for electromagnetic waves having a frequency of 1 GHz or more,
    wherein the first mesh structure comprises a pattern of through-holes having a first shape,
    wherein the second mesh structure comprises a pattern of through-holes having a second shape, wherein the first shape and the second shape are the same, and
    wherein the second mesh structure comprises a through-hole pattern which represents a non-integer multiple of a through-hole pattern of the first mesh structure.

2. The housing wall according to claim 1, wherein the through-holes of the first mesh structure are oriented in parallel and shifted compared to the through-holes of the second mesh structure with regard to respective extension axes.

3. The housing wall according to claim 1, wherein the through-holes of the first mesh structure are different from the through-holes of the second mesh structure at least with regard to one of a cross-sectional area, a shape, and a circumference.

4. The housing wall according to claim 1, wherein the first layer and the second layer are electrically conductively coupled at a plurality of connection points establishing a surface-wise electrical connection.

5. The housing wall according to claim 1, wherein the first layer and the second layer are at least partially coupled via soldering or an electrically conductive adhesive connection.

6. The housing wall according to claim 5, wherein the first layer and the second layer are at least partially coupled via at least one of vapor phase soldering and ultrasonic welding.

7. The housing wall according to claim 1, wherein the housing wall comprises a thickness of 5 mm or more along an extension axis of the through-holes of the mesh structures.

8. The housing wall according to claim 1, wherein the first layer has a first thickness, wherein the second layer has a second thickness, and wherein the second thickness is greater than the first thickness.

\* \* \* \* \*